United States Patent
Suzuki et al.

(10) Patent No.: US 10,381,314 B2
(45) Date of Patent: Aug. 13, 2019

(54) METHOD OF MANUFACTURING MOUNTING MEMBER AND METHOD OF MANUFACTURING ELECTRONIC COMPONENT

(71) Applicant: CANON KABUSHIKI KAISHA, Tokyo (JP)

(72) Inventors: Takanori Suzuki, Tokyo (JP); Kazuya Notsu, Yokohama (JP); Ryuji Oyama, Oita (JP)

(73) Assignee: Canon Kabushiki Kaisha, Tokyo (JP)

( * ) Notice: Subject to any disclaimer, the term of this patent is extended or adjusted under 35 U.S.C. 154(b) by 699 days.

(21) Appl. No.: 14/192,702

(22) Filed: Feb. 27, 2014

(65) Prior Publication Data

US 2014/0237805 A1 Aug. 28, 2014

(30) Foreign Application Priority Data

Feb. 28, 2013 (JP) .................. 2013-039447

(51) Int. Cl.
*H01L 23/00* (2006.01)
*H01L 23/10* (2006.01)
(Continued)

(52) U.S. Cl.
CPC ............ *H01L 23/562* (2013.01); *H01L 21/50* (2013.01); *H01L 23/055* (2013.01); *H01L 23/10* (2013.01);
(Continued)

(58) Field of Classification Search
CPC ....... H05K 13/00; H01L 23/562; H01L 23/10; H01L 23/055; H01L 23/32; H01L 21/50;
(Continued)

(56) References Cited

U.S. PATENT DOCUMENTS

| 2007/0200053 A1* | 8/2007 | Nomura ............ H01L 27/14618 250/206 |
| 2008/0043127 A1* | 2/2008 | Mochizuki ........ H01L 27/14618 348/294 |

(Continued)

FOREIGN PATENT DOCUMENTS

| JP | 2638883 B2 * | 8/1997 |
| JP | 2638883 B2 * | 8/1997 |

(Continued)

*Primary Examiner* — Peter Dungba Vo
*Assistant Examiner* — Azm A Parvez
(74) *Attorney, Agent, or Firm* — Canon U.S.A., Inc. IP Division (57) ABSTRACT

The method of the invention includes: placing a base member and a frame member having a thermal expansion coefficient different from a thermal expansion coefficient of the base member in a state in which the base member is stacked with the frame member and a thermosetting adhesive agent is interposed between the base member and the frame member; adhering the base member and the frame member by heating the base member, the frame member, and the adhesive agent from the state to a temperature equal to or higher than a curing temperature of the adhesive agent; and cooling the base member and the frame member from the curing temperature. The frame member in the state is warped so that a flatness error of the frame member after having been cooled becomes smaller than that in a case where the frame member is flat in the state.

14 Claims, 7 Drawing Sheets

(51) Int. Cl.
*H01L 23/055* (2006.01)
*H01L 23/32* (2006.01)
*H01L 21/50* (2006.01)

(52) U.S. Cl.
CPC .............. *H01L 23/32* (2013.01); *H01L 24/73* (2013.01); *H01L 2224/32225* (2013.01); *H01L 2224/45144* (2013.01); *H01L 2224/48091* (2013.01); *H01L 2224/48227* (2013.01); *H01L 2224/73265* (2013.01); *H01L 2924/1531* (2013.01); *H01L 2924/15153* (2013.01); *H01L 2924/16195* (2013.01); *H01L 2924/3511* (2013.01); *Y10T 29/49002* (2015.01)

(58) Field of Classification Search
CPC ... H01L 2924/15153; H01L 2924/3511; H01L 2924/16195; H01L 2924/1531; H01L 2924/00; H01L 2924/00014; H01L 2224/32225; H01L 2224/48091; H01L 2224/48227; H01L 2224/73265; H01L 2224/45144; Y10T 29/49002; Y10T 29/49117; Y10T 29/49124; Y10T 29/49126; Y10T 29/49128; Y10T 29/4913

USPC ............... 29/592.1, 825, 829, 832, 830, 831
See application file for complete search history.

(56) References Cited

U.S. PATENT DOCUMENTS

| | | | |
|---|---|---|---|
| 2009/0085228 A1* | 4/2009 | Sun | H01L 23/3157 257/783 |
| 2009/0140405 A1* | 6/2009 | Maruo | H01L 23/055 257/680 |

FOREIGN PATENT DOCUMENTS

| | | | |
|---|---|---|---|
| JP | 2000012718 A | * | 1/2000 |
| JP | 2000012718 A | * | 1/2000 |
| JP | 2002026068 A | | 1/2002 |
| JP | 2003100920 A | | 4/2003 |
| JP | 2004356218 A | | 12/2004 |
| JP | 2005012148 A | | 1/2005 |
| JP | 2007208045 A | | 8/2007 |
| JP | 2010252307 A | | 11/2010 |
| JP | 2011018747 A | | 1/2011 |
| JP | 2011066091 A | | 3/2011 |

* cited by examiner

METHOD OF MANUFACTURING MOUNTING MEMBER AND METHOD OF MANUFACTURING ELECTRONIC COMPONENT

BACKGROUND OF THE INVENTION

Field of the Invention

This disclosure relates to a method of manufacturing a mounting member provided with a frame member and a base member.

Description of the Related Art

A mounting member provided with a base member having an arrangement region for arranging an electronic device and a frame member having an opening corresponding to the arrangement region and configured to be adhered to the base member is used for an electronic component. Since a material used for the frame member may be different from a material used for the base member, performance of the electronic component may be improved.

Japanese Patent Laid-Open No. 2007-208045 discloses a configuration in which a frame member is bonded to a wiring substrate (base member) with a thermosetting adhesive agent, and a thermal expansion coefficient of the frame member is smaller than a thermal expansion coefficient of the wiring substrate.

In a case where the thermosetting adhesive agent is used as in Japanese Patent Laid-Open No. 2007-208045, there arises a problem that warpage likely occurs in the frame member when the base member and the frame member contract. The warpage occurring in the frame member may lead to lowering of a yield in a manufacturing process and lowering of performance of an imaging apparatus.

SUMMARY OF THE INVENTION

In order to solve the problems described above, there is provided a method of manufacturing a mounting member including a base member having an arrangement region for an electronic device, and a frame member having an opening corresponding to the arrangement region and adhered to a periphery of the arrangement region of the base member, including: placing the base member and the frame member having a thermal expansion coefficient different from a thermal expansion coefficient of the base member in a state in which the base member is stacked with the frame member and a thermosetting adhesive agent is interposed between the base member and the frame member; adhering the base member and the frame member by heating the base member, the frame member, and the adhesive agent from the state to a temperature equal to or higher than a curing temperature of the adhesive agent; and cooling the base member and the frame member from the curing temperature, wherein the frame member in the state is warped so that a flatness error of the frame member after having been cooled becomes smaller than that in a case where the frame member is flat in the state.

Further features of the present invention will become apparent from the following description of exemplary embodiments with reference to the attached drawings.

DESCRIPTION OF THE EMBODIMENTS

Figure 1A:
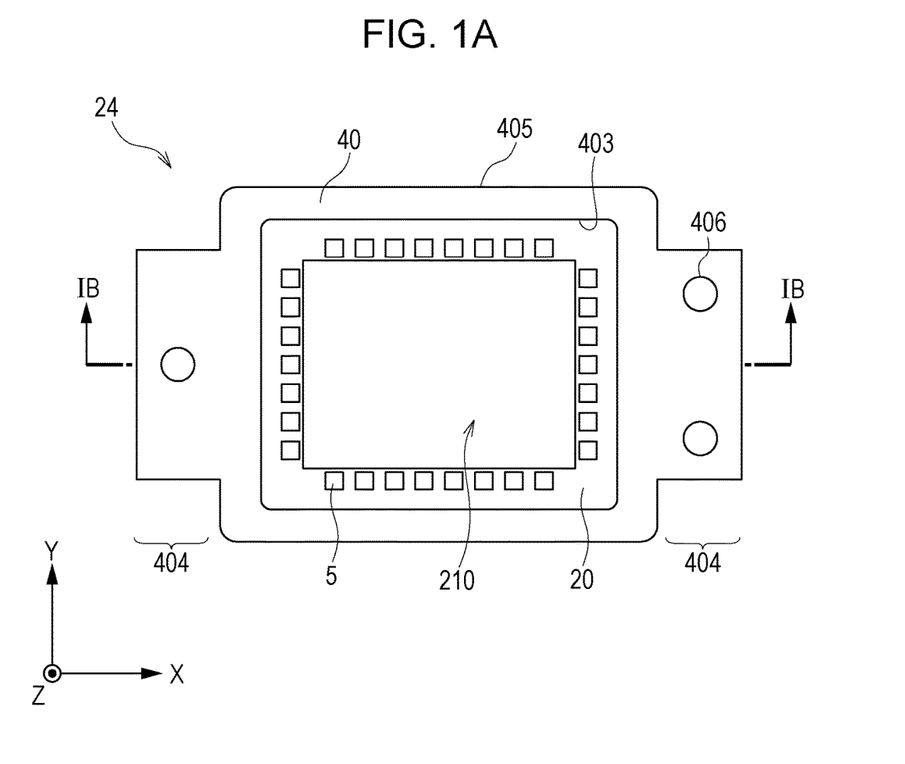
FIGS. 1A and 1B are schematic drawings of an example of a mounting member.
Figure 1B:
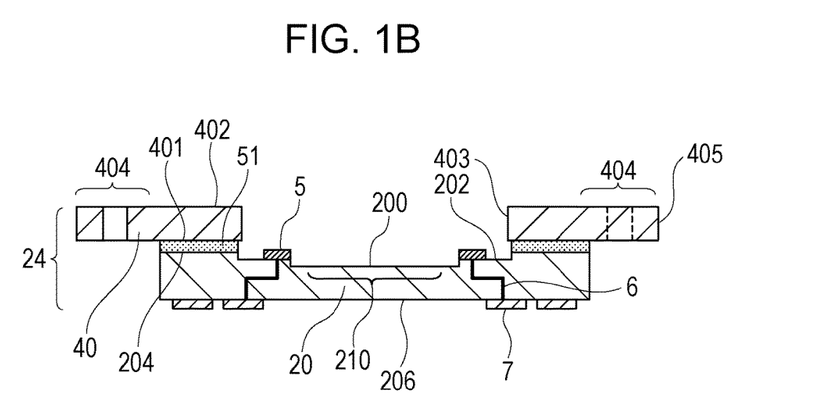

Referring now to FIGS. 1A and 1B, an example of a configuration of a mounting member of an embodiment disclosed here will be described. FIG. 1A is a plan view of a mounting member 24, and FIG. 1B is a cross-sectional view of the mounting member 24 taken along a line IB-IB in FIG. 1A. The mounting member 24 includes a base member 20 and a frame member 40. The base member 20 and the frame member 40 are bonded via a joint member 51 formed of a cured thermosetting adhesive agent.

The base member 20 includes a center portion and a peripheral portion in the periphery thereof, and includes an arrangement area 210 for an electronic device at the center portion thereof. The arrangement area 210 is positioned on a lower level portion 200 which is depressed with respect to the peripheral portion. The base member 20 includes a middle level portion 202 projecting with respect to the lower level portion 200 via a level difference portion, and an upper level portion 204 projecting with respect to the middle level portion 202 via a level difference portion in the peripheral portion. In this example, the middle level portion 202 and the upper level portion 204 have a frame shape surrounding the center portion. The middle level portion 202 is provided with a terminal region on which internal terminals 5 connected to electrodes of the electronic devices are arranged on then arrangement region 210. The internal terminals 5 are connected to external terminals 7 arrayed on a back surface 206 of a base member 20 via embedded portions 6. Here, the external terminals 7 are LGA terminals. However, a configuration in which a lead frame is used and the internal terminals 5 are replaced by inner leads and the external terminals 7 are replaced by outer leads is also applicable. The frame member 40 is adhered to an adhering region of the upper level portion 204 via the joint member 51. Here, the base member 20 includes the lower level portion 200, the middle level portion 202, and the upper level portion 204. The structure in which the upper level portion 204 includes the adhering region, the middle level portion 202 includes the terminal region, and the lower level portion 200 includes the arrangement region respectively has been described. However, at least two of the arrangement region 210, the terminal region, and the adhering region of the base member 20 may be flush with each other without the level difference.

The frame member 40 includes an opening at a position corresponding to the arrangement region 210. The frame member 40 includes an inner edge 403 and an outer edge 405, and the opening is a region surrounded by the inner edge 403 of the frame member 40. However, the opening does not have to be completely surrounded by the inner edge 403 and, for example, the frame member 40 may have a slit having a width smaller than 10% of the length of a circumference in the circumference direction. The frame member 40 includes a lower surface 401, which corresponds to a surface on the side where the base member 20 resides, and an upper surface 402, which corresponds to a surface opposite thereto and a surface on the side where a lid member 30 resides.

Figure 2:
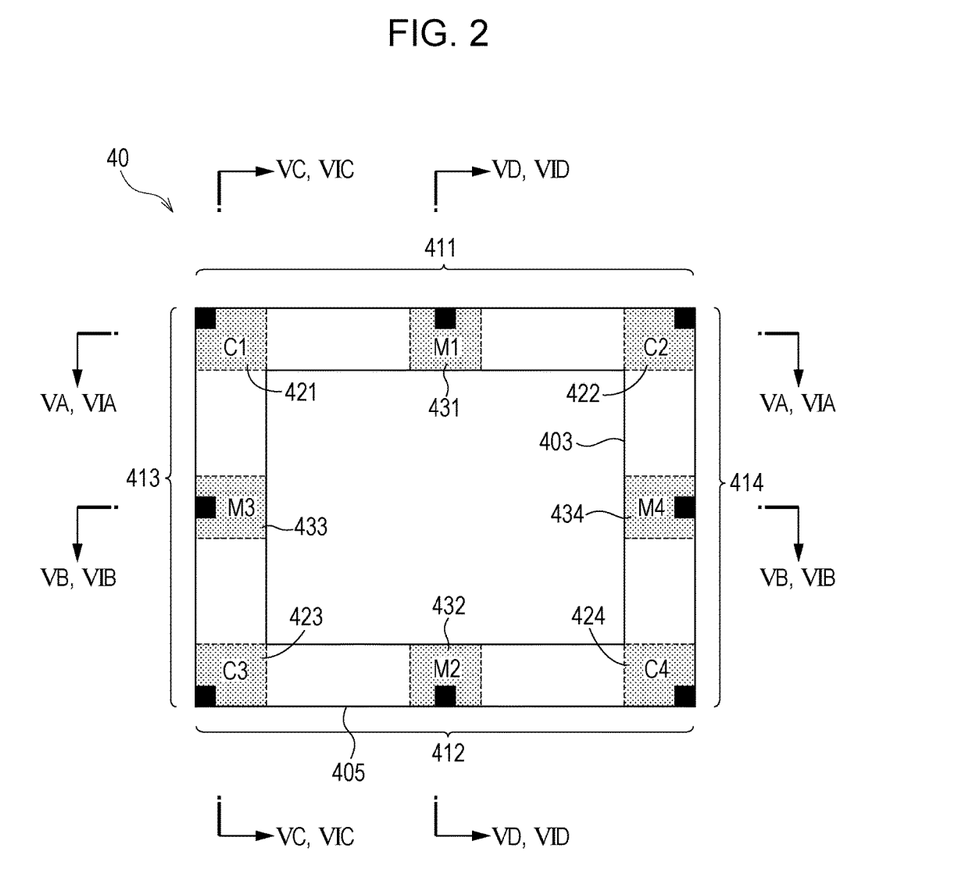
FIG. 2 is a schematic drawing of an example of a frame member.

The frame member 40 of this example has a quadrilateral. FIG. 2 schematically illustrates a planar shape of the frame member 40. Four sides of the frame member 40 include a first side 411, a second side 412, a third side 413, and a fourth side 414. The respective sides correspond to respective sides of the inner edge 403, which forms a quadrilateral. The respective sides includes one band portion and two corners. The band portion is a portion interposed between the outer edge 405 and the inner edge 403 having a quadrilateral and having a width to a certain degree. The two corners are positioned on the both sides of the band portion, and continue to the band portion. Adjacent two sides share one corner. The four corners of the frame member 40 include a first corner 421, a second corner 422, a third corner 423, and a fourth corner 424. The first side 411 includes the first corner 421 an the second corner 422, and the second side 412 includes the third corner 423 and the fourth corner 424. The third side 413 includes the first corner 421 and the third corner 423, and the fourth side 414 includes the second corner 422 and the fourth corner 424. Each side includes an intermediate portion between two corners as part of the band portion. The intermediate portion includes an intermediate point positioned at the same distance from the two corners of the corresponding side, and is away from the two corners of the corresponding side. The first side 411 includes a first intermediate portion 431 between the first corner 421 and the second corner 422, and the second side 412 includes a second intermediate portion 432 between the third corner 423 and the fourth corner 424. In the following description, a case where the first side 411 and the second side 412 are longer than the third side 413 and the fourth side 414 will be described. However, the lengths of the four sides may be equal, and the first side 411 and the second side 412 may be shorter than the third side 413 and the fourth side 414. In this example, the first side 411 and the second side 412, and the third side 413 and the fourth side 414 are parallel to each other, respectively. However, these sides do not necessarily have to be parallel. Although an example in which the sides adjacent to each other with a common corner form a right angle is described, the angle may be an acute angle or an obtuse angle. The inner edge 403 or the outer edge 405 corresponding to the corners of the frame member 40 may have a curvature as illustrated in FIG. 1A.

As illustrated in FIGS. 1A and 1B, the frame member 40 may partly include an expanded portion 404 having a larger width (the distance between the inner edge 403 and the outer edge 405), but the expanded portion 404 do not necessarily have to be provided. The expanded portion 404 is provided with a through hole 406, and the through hole 406 may be used as a screw hole for a fixation to a housing or the like of an electronic apparatus, or may be used as a positioning hole. For example, FIGS. 1A and 1B illustrate a configuration in which the expanded portions 404 are provided on the third side 413 and the fourth side 414, and no expanded portion 404 is provided on the first side 411 and the second side 412.

A material of the frame member 40 may be selected from materials having a thermal expansion coefficient different from a thermal expansion coefficient of the base member 20. The thermal expansion coefficient of the frame member 40 may be lower than the thermal expansion coefficient of the base member 20. However, the thermal expansion coefficient of the frame member 40 is preferably higher than the thermal expansion coefficient of the base member 20. No factor other than the thermal expansion coefficient is specifically required for the material of the frame member 40. As the material of the frame member 40, for example, either conductive materials or insulating materials, either magnetic materials or non-magnetic materials, and either organic materials or inorganic materials are applicable. Examples of the material of the frame member 40 include metallic materials, ceramic materials, or resin materials. Examples of the metallic materials include aluminum, aluminum alloy, copper, copper alloy, iron, and iron alloy. When considering a case where the electronic apparatus on which the electronic devices are mounted is used outdoors, aluminum, aluminum alloy, or iron alloy superior in corrosion resistance are suitable. Examples of the iron alloy which may be employed include SUS430, which is a ferrite-based stainless steel, and SUS304, which is an austenitic stainless steel.

Subsequently, a method of manufacturing the mounting member according to the embodiment disclosed here will be described with reference to respective manufacturing steps of FIGS. 3A to 3E which correspond to the cross section taken along a line IB-IB in FIG. 1A.

Figure 3A:
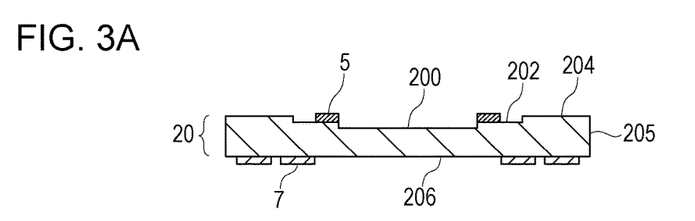
FIGS. 3A to 3E are schematic drawings of an example of a method of manufacturing the mounting member.

FIG. 3A is a step of preparing the base member 20 before being adhered to the frame member 40. The base member 20 integrally includes the internal terminals 5 and the external terminals 7. The base member 20 in this configuration may be formed of a ceramic laminated wiring substrate formed for example as follows. First of all, punching work is performed on green sheets formed by using a sheet molding method such as a doctor blade method or a calendar roll method to achieve a plate shape, and a plurality of the plate-shaped green sheets are laminated to form a row ceramic plate part. Punching work is also performed on green sheets formed in the same manner to achieve a frame shape, and a plurality of the frame-shaped green sheets are laminated to form a row ceramic frame part. The plate part and the frame part are placed one on top of another and a laminated member of the frame part and the plate part is baked to manufacture a ceramic laminate having a concave shape, which can be used as the base member 20. The internal terminals 5, the external terminals 7, and the embedded portions 6, not illustrated, that electrically connects the internal terminals 5 and the external terminals 7 may be formed by baking a conductive paste pattern formed by a screen printing method or the like in the process of laminating the green sheets.

Figure 3B:
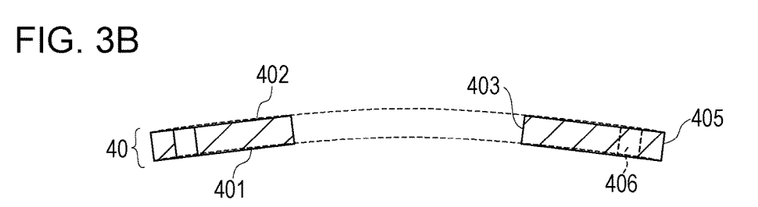

FIG. 3B is a step of preparing the frame member 40 before being adhered to the base member 20. In this example, the thermal expansion coefficient of the frame member 40 is higher than the thermal expansion coefficient of the base member 20. FIG. 3B schematically illustrates that the frame member 40 is warped. The warped frame member 40 as described above may be obtained easily by using an injection molding method if the material is a resin. If the frame member is formed of a metal, warpage is easily achieved by performing a bending process or the like on the frame-shaped metal plate formed by punching work or the like. Although a direction and an amount of warpage will be described later in detail, the frame member 40 is considered to be warped if at least one of the sides of the frame member 40 is warped.

Figure 3C:
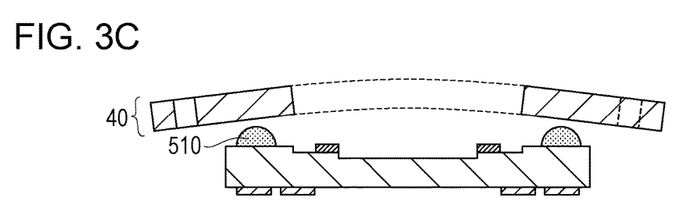

FIG. 3C is a step of placing the frame member 40 on the base member 20 in a state in which the adhesive agent 510 is interposed therebetween. First of all, the thermosetting adhesive agent 510 is applied to at least one of the base member 20 and the frame member 40. Examples of the thermosetting adhesive agent 510 which may be used here include an adhesive agent of an epoxy based resin or the like which provides an adhesion property by being cured by heat. Application of the adhesive agent 510 is achieved by using a printing method or a dispensing method. Although the adhesive agent 510 is applied to the base member 20 in this example, the adhesive agent 510 may be applied to the frame member 40. However, since the frame member 40 is warped as described above, it may be rather difficult to apply the adhesive agent 510 uniformly. Therefore, the adhesive agent 510 is preferably applied to the base member 20.

Subsequently, the frame member 40 is held by a suction handling, for example, and is moved to a position above the upper level portion 204 which includes the adhesion region to which the adhesive agent 510 is applied. The frame member 40 and the base member 20 are moved toward each other until the adhesive agent 510 comes into contact with both of the frame member 40 and the base member 20 after the mutual positioning thereof have confirmed. At this time, an entire circumference of an adhesion surface may be pressed adequately so as to ensure sealing thereof. However, the pressure to be applied at the time of pressing needs to be adjusted so as to avoid irreversible cancellation of warpage of the frame member 40 and maintain the warpage of the frame member 40. At this time point, the adhesive agent 510 stays liquid without being cured. Here, an example in which the adhesive agent 510 is applied to the base member 20 or the frame member 40 before stacking the base member 20 with the frame member 40 has been given above. However, the adhesive agent 510 may be injected between the base member 20 and the frame member 40 after the base member 20 and the frame member 40 have been stacked. The frame member 40 which is warped in advance in the step illustrated in FIG. 3B described above is kept warped on the base member 20 after the step of stacking is terminated.

The direction of warpage of the frame member 40 with respect to the base member 20 is determined on the basis of a magnitude relationship in the thermal expansion coefficient between the frame member 40 and the base member 20. As in this example, when the thermal expansion coefficient of the frame member 40 is higher than the thermal expansion coefficient of the base member 20, the frame member 40 and the base member 20 are stacked each other so that the frame member 40 projects toward the side away from the base member 20. In contrast, when the thermal expansion coefficient of the frame member 40 is lower than the thermal expansion coefficient of the base member 20, the frame member 40 and the base member 20 are stacked each other so that the frame member 40 projects toward the base member 20.

Figure 3D:
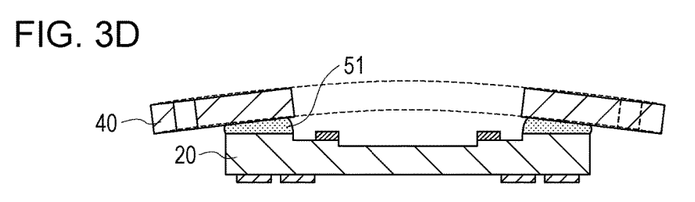

FIG. 3D is a step of curing the adhesive agent 510 by heating the base member 20, the frame member 40, and the adhesive agent 510.

After the step in FIG. 3C, the base member 20, the adhesive agent 510, and the frame member 40 are heated from a low temperature (the room temperature) until an adequate temperature (curing temperature) at which the adhesive agent 510 is cured by heat is achieved. The thermosetting temperature is higher than the room temperature and is, for example, between 80 and 200° C. Examples of devices to be used for curing the thermosetting adhesive agent 510 include an oven or a hot plate. At a time point when the curing temperature has been reached and a certain period of time has elapsed, the adhesive agent 510 which has been a liquid state becomes the solid joint member 51. Therefore, the base member 20 and the frame member 40 are fixed to each other at a temperature not lower than the curing temperature. At temperatures not lower than the curing temperature (hereinafter, referred to as a high temperature), expansion occurs in accordance with the thermal expansion coefficients of the base member 20 and the frame member 40 in comparison with those at a temperature before being heated (hereinafter, referred to as a low temperature). The base member 20 and the frame member 40 are fixed by the joint member 51 in a positional relationship in a state in which thermal expansion has occurred. The step illustrated in FIG. 3C and the step illustrated in FIG. 3D may be performed simultaneously. For example, the frame member 40 and the base member 20 may be heated at a time point when the adhesive agent 510 is brought into contact with both of the frame member 40 and the base member 20. The color of the thermosetting adhesive agent 510 and the joint member 51 may be of any color such as white, black, and transparent without being limited. The adhesive agent 510 and the joint member 51 may include inorganic or organic filler to an adequate amount. Including the filler contributes to an improvement of moisture resistance. Although a coefficient of elasticity of the joint member 51 after the adhesive agent 510 has been cured is not specifically limited, relatively soft resins (resin having low coefficients of elasticity) having coefficients of elasticity, for example, in a range from 1 MPa to 100 GPa inclusive are preferable.

Figure 3E:
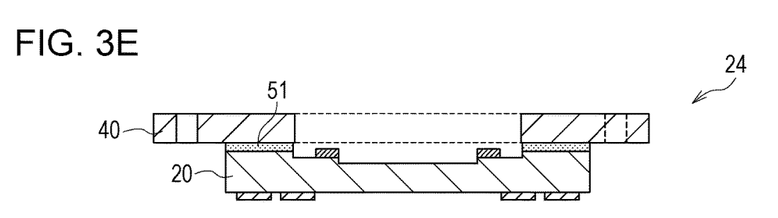

FIG. 3E is a step of cooling the heated base member 20, frame member 40 and joint member 51. A method of cooling is not specifically limited, and may be natural cooling or forced cooling using air cooling or the like. The cooling temperature may be, for example, the room temperature, and the cooling step is completed when the room temperature is reached. In this cooling step, a deformation, which is a deformation in which warpage is reduced, occurs in the frame member 40. The term "a deformation in which warpage is reduced" here corresponds to "a phenomenon including a process in which the amount of warpage is reduced toward a flat shape". The deformation that may occur at the time of cooling may be absorbed by deforming (warping) the frame member 40 in a direction opposite to a direction of deformation generated in the frame member 40 at the time of cooling. Accordingly, the mounting member 24 provided with the frame member 40 having a small flatness error may be obtained. The term "flatness error" here means a magnitude of deviation of a surface to be used from a geometrically exact "flat", and is expressed when the surface to be used is interposed between two parallel surfaces which are geometrically exact flat by a minimum distance formed between two flat surfaces. Therefore, the smaller the flatness error, the higher the flatness of the surface becomes. Warpage of the frame member 40 before adhesion is set as follows. Under a first condition, the flatness error of the frame member 40 before adhesion is defined to be A, and the flatness error of the frame member 40 after the adhesion (after cooling) is defined to be B. Under a second condition, the flatness error of the frame member 40 before adhesion is defined to be C, and the flatness error of the frame member 40 after the adhesion (after cooling) is defined to be D. Now, under the first condition, a deformation in which the flatness error B of the frame member 40 after adhesion (after cooling) becomes smaller than the flatness error A of the frame member 40 before adhesion (B<A) occurs. Under the second condition, a deformation in which the flatness error D of the frame member 40 after adhesion (after cooling) becomes larger than the flatness error C of the frame member 40 before adhesion (C<D) occurs. Now, the flatness error A under the first condition is larger than the flatness error C under the second condition (A>C). In other words, the flatness of the frame member 40 under the second condition is higher than that of the frame member 40 under the first condition before adhesion. The flatness error B under the first condition is smaller than the flatness error D under the second condition (B<D). In other words, the flatness of the frame member 40 under the first condition is higher than that of the frame member under the second condition after cooling. The warpage that the frame member 40 needs to have before adhesion is warpage which satisfies the first condition in the relationship described above.

In other words, the frame member 40 in a state of being stacked before adhesion, has warpage that the flatness error of the frame member 40 after cooling becomes smaller (flatness A) than that under the second condition in which the frame member 40 in the state of being stacked is flat (flatness C).

In this state in which cooling is terminated, the frame member 40 may have warpage in a direction opposite to the direction of warpage of the frame member 40 before adhesion. In other words, the frame member 40 that has been warped so as to project in a direction away from the base member 20 before heating may be warped so as to project toward the base member 20 after cooling. Alternatively, the frame member 40 that has been warped so as to project in a direction toward the base member 20 before heating may be warped so as to project toward the base member 20 after cooling. In this process, warpage of the frame member 40 is reduced at a temperature at least higher than the room temperature, so that the frame member 40 becomes flat once, and then is warped in the opposite direction by being further cooled from that state. In a process of manufacturing an electronic component using the mounting member 24, which is described later, there is a case where it is rather preferable to have some warpage in the opposite direction. In the case where the frame member 40 is warped in the opposite direction after adhesion as described above, it is preferable that the amount of warpage in the opposite direction after adhesion is smaller than the amount of warpage of the frame member 40 before adhesion. However, the amount of warpage in the opposite direction after adhesion may be larger than the amount of warpage before adhesion. It is because when the warpage in the opposite direction occurs in this manner, the amount of warpage after adhesion may be reduced in the case where the frame member 40 is warped before adhesion than a case where the frame member 40 is not warped before adhesion. However, when the frame member 40 is extremely warped before adhesion, even when a deformation in which the degree of warpage is reduced in the course of cooling occurs, there remains an extreme degree of warpage and, consequently, formation of warpage in advance is rarely useful. In other words, formation of extreme warpage in the frame member 40 in advance that makes the flatness error of the frame member 40 after cooling becomes larger than that formed under the second condition in which the flat frame member 40 is used should be avoided.

A change of warpage of the frame member 40 will be described. In the cooling process, in the course of cooling, contraction in accordance with the thermal expansion coefficient occurs from a state under high temperatures at the time of heating. As described above, since the frame member 40 has a higher thermal expansion coefficient than that of the base member 20 in this example, the amount of construction of the base member 20 is larger than the amount of contraction of the base member 20. Since the frame member 40 and the base member 20 are fixed to each other in a state of high temperature, the frame member 40 is deformed toward flatness so as to alleviate a difference in amount of contraction between the frame member 40 and the base member 20. The larger the difference in the amount of contraction between the frame member 40 and the base member 20, the higher the likelihood of occurrence of warpage in the direction opposite to the frame member 40 becomes. In FIG. 3E, the base member 20 is illustrated to be flat both before heating and after cooling. Actually, however, the base member 20 is likely warped following a reduction of warpage of the frame member 40. Specifically, the warpage in the direction opposite to the direction of warpage of the frame member 40 before heating occurs in the base member 20 after cooling. For example, when the frame member 40 is warped so as to project in the direction away from the base member 20 before heating, the base member 20 is likely warped in the direction so as to project in a direction away from the frame member 40 after cooling.

Figure 4A:
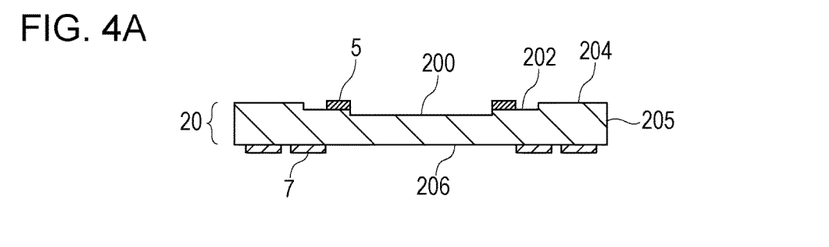
FIGS. 4A to 4E are schematic drawings of an example of the method of manufacturing the mounting member.
Figure 4B:
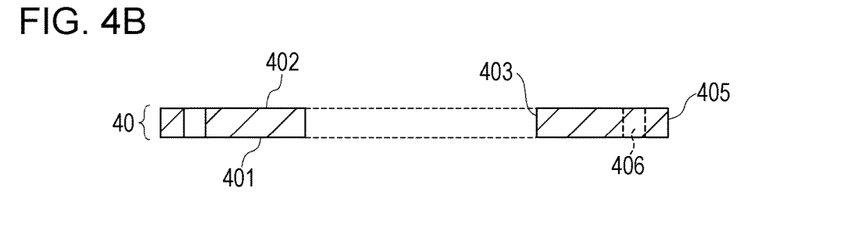
Figure 4C:
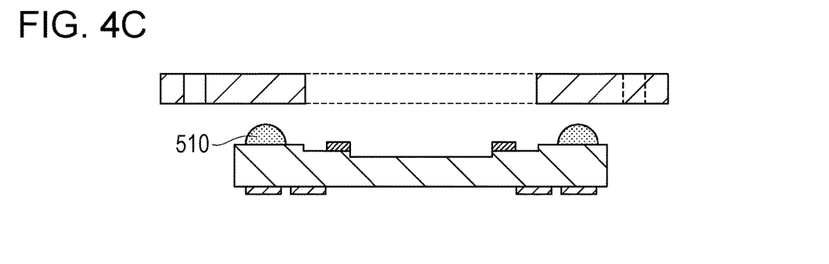
Figure 4D:
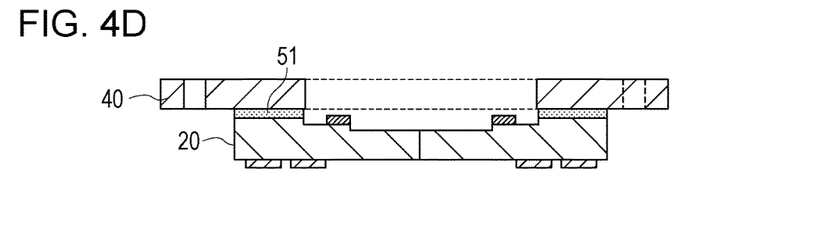
Figure 4E:
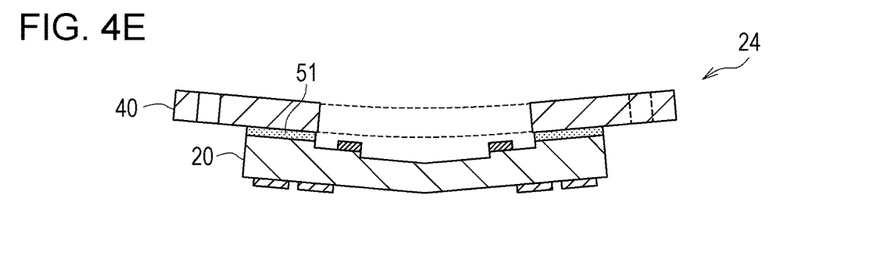

As a comparative example of this example, a method of manufacturing the mounting member according to the embodiment disclosed here for reference will be described with reference respective manufacturing steps of FIGS. 4A to 4E which correspond to the cross section taken along the line IB-IB in FIG. 1A. FIGS. 4A to 4E correspond to FIGS. 3A to 3E and illustrate a manufacturing method for describing a case where the frame member 40 which is not warped is prepared. As illustrated in FIG. 4B, FIG. 4C, and FIG. 4D, the frame member 40 is not warped before curing of the adhesive agent 510. In a state after the cooling step in FIG. 4E, the base member 20 and the frame member 40 are significantly warped. It is because warpage is increased in the cooling step. Even when the base member 20 and the frame member 40 have the same shape, in the case where the magnitude relationship in the thermal expansion coefficients between the base member 20 and the frame member 40 are opposite to the example illustrated in FIGS. 4A to 4E (the case where the thermal expansion coefficient of the base member is higher than the frame member), the warpage in a direction opposite to the state illustrated in FIG. 4E may occur in a scale larger than the state illustrated in FIG. 4E. Usage of the frame member 40 having a thermal expansion coefficient higher than the thermal expansion coefficient of the base member 20 alleviates an influence of a difference in thermal expansion coefficient between the base member 20 and the frame member 40 on a flatness of the mounting member 24 than the usage of the frame member 40 having a thermal expansion coefficient lower than the thermal expansion coefficient of the base member 20. Therefore, it may be said that the relationship in which the thermal expansion coefficient of the frame member 40 is higher than the thermal expansion coefficient of the base member 20 is effective for the improvement of the flatness of the mounting member 24.

Figure 5A:
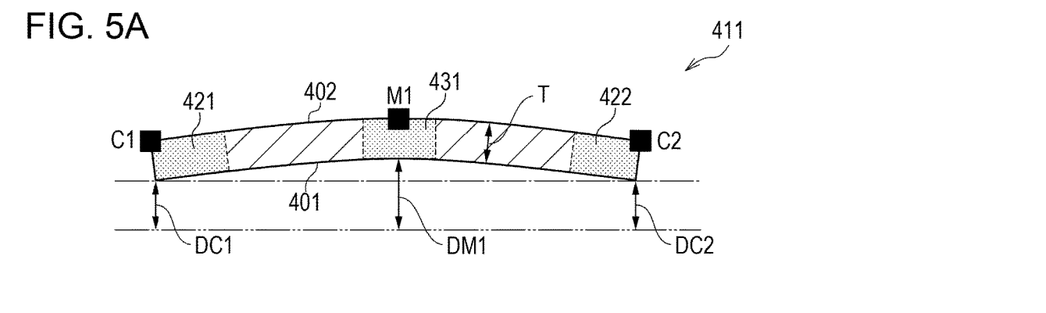
FIGS. 5A to 5D are schematic drawings of an example of the frame member.
Figure 5B:
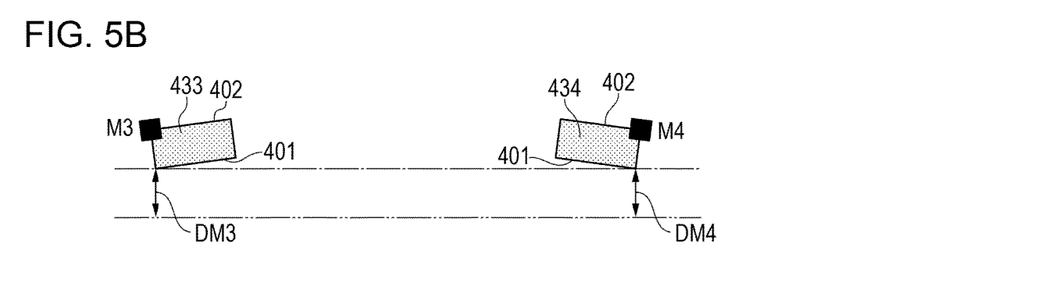
Figure 5C:
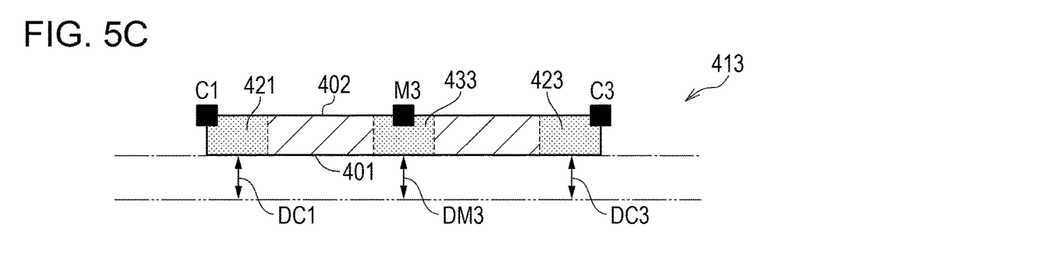
Figure 5D:
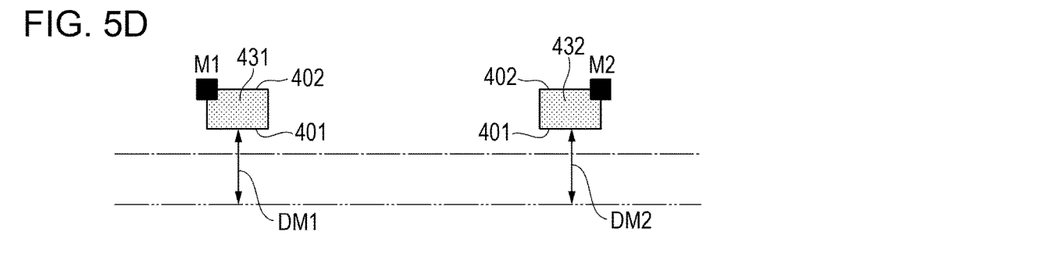
Figure 6A:
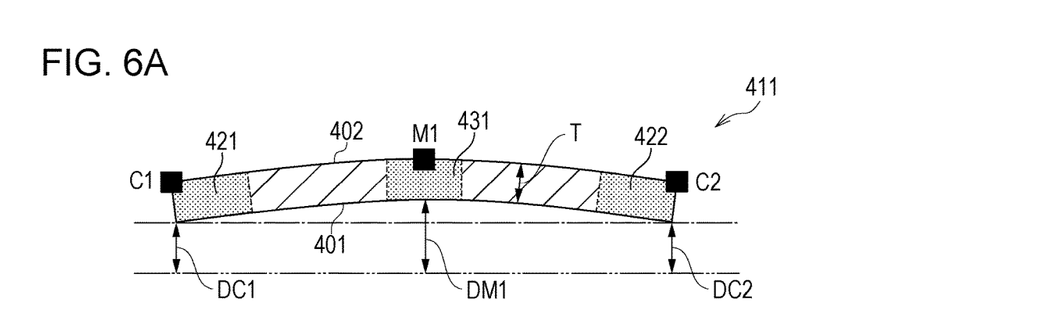
FIGS. 6A to 6D are schematic drawings of an example of the frame member.
Figure 6B:
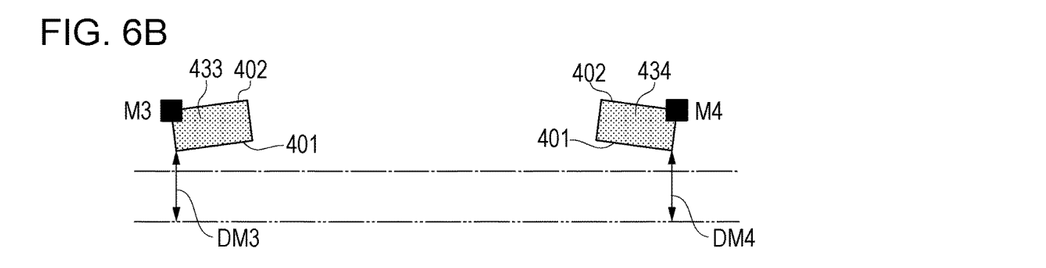
Figure 6C:
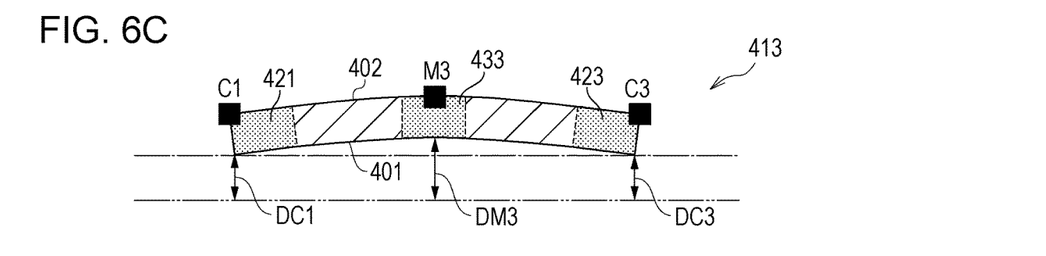
Figure 6D:
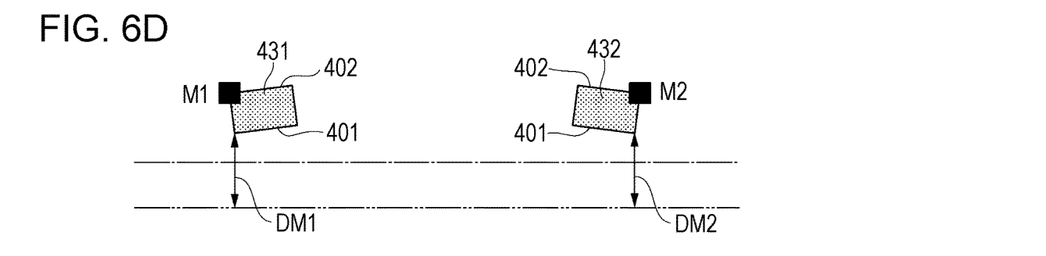

Subsequently, warpage of the frame member 40 of a first example and a second example will be described in detail with reference to FIGS. 5A to 5D and FIGS. 6A to 6D, respectively. FIG. 5A and FIG. 6A are cross-sectional views of a first side 411 taken along a line VA, VIA-VA, VIA in FIG. 2, and FIG. 5B and FIG. 6B are cross-sectional view of the first side 411 and the second side 412 taken along a line VB, VIB-VB, VIB in FIG. 2. FIG. 5C and FIG. 6C are cross-sectional views of the third side 413 taken along a line VC, VIC-VC, VIC in FIG. 2, and FIG. 5D and FIG. 6D are cross-sectional views of the third side 413 and the fourth side 414 taken along the line VD, VID-VD, VID in FIG. 2. The first side 411 and the second side 412 are long sides, and the third side 413 and the fourth side 414 are short sides. The second side 412 may have warpage equivalent to that of the first side 411 opposing thereto, and the third side 413 may have warpage equivalent to that of the fourth side 414 opposing thereto. Therefore, only one of the opposed two sides will be described, and description of the other side is omitted.

Chain lines in FIGS. 5A to 5D and FIGS. 6A to 6D indicate a reference plane, which is an imaginary plane for evaluating the flatness of the frame member 40. The reference plane corresponds to a flat surface in the case where the frame member 40 is placed on a table or the like such as a surface plate having the flat surface. The double chain lines illustrated in FIGS. 5A to 5D and FIGS. 6A to 6D schematically drawn by a flat surface indicate a joint surface of the base member 20 on which the frame member 40 is placed via the adhesive agent 510 before curing. In other words, a distance between the frame member 40 and the double chain lines in FIGS. 5A to 5D and FIGS. 6A to 6D indicates a distance between the base member 20 and respective points of the frame member 40 in a state in which the frame member 40 is stacked with the base member 20 via the adhesive agent 510 before curing. The adhesive agent 510 is not illustrated. The adhesion surface of the actual base member 20 may include fine roughness or a roll. However, the roll of the adhesion surface of the base member 20 is smaller than that on the lower surface 401 of the frame member 40 caused by warpage of the frame member 40.

As illustrated in FIG. 5A, the first side 411 is warped in a direction in which a distance DM1 between the first intermediate portion 431 and the base member 20 is larger than a distance DC1 between the first corner 421 and the base member 20 and a distance DC2 between the second corner 422 and the base member 20. In the same manner, the second side 412 is warped in a direction in which a distance between the second intermediate portion 432 and the base member 20 is larger than a distance between the third corner 423 and the base member 20 and a distance between the fourth corner 424 and the base member 20. In other words, the first side 411 and the second side 412 are warped so as to project in the direction away from the base member 20. In the cooling step to be performed after heating, warpage of the first side 411 and the second side 412 is reduced.

Here, at least one of the first corner 421 and the second corner 422 may be in contact with the base member 20, and the distance DC1 and the distance DC2 may be 0. The first intermediate portion 431 is away from the base member 20, and the distance DM1 becomes larger than 0. FIG. 5B illustrates a distance DM3 between a third intermediate portion 433 and the base member 20, and a distance DM4 between a fourth intermediate portion 434 and the base member 20.

As illustrated in FIG. 5C, the third side 413 and the fourth side 414 are not warped and are flat. Therefore, the distance DM3 between the third intermediate portion 433 and the base member 20 is smaller than the distance DM1 between the first intermediate portion 431 and the base member 20. In the same manner, the distance between the fourth intermediate portion 434 and the base member 20 is smaller than the distance between the third intermediate portion 433 and the base member 20.

The third side 413 and the fourth side 414, which are the short sides, may be warped in a direction opposite to warpage of the first side 411 and the second side 412, which are the long sides. In other words, the third side 413 may be warped in a direction in which the distance DM3 between the third intermediate portion 433 and the base member 20 is smaller than a distance DC1 between the first corner 421 and the base member 20 and a distance DC3 between the third corner 423 and the base member 20. In this case as well, the distance DM3 may be smaller than the distance DM1. In the same manner, the fourth side 414 may be warped in a direction in which the distance DM4 between the fourth intermediate portion 434 and the base member 20 is smaller than the distance DC2 between the second corner 422 and the base member 20 and a distance DC4 between the fourth corner 424 and the base member 20.

In a second example illustrated in FIG. 6A as well, the first side 411 is warped in the direction in which the distance DM1 becomes larger than the distance DC1 and the distance DC2 in the same manner as in the first example. Then, in the cooling step to be performed, warpage of the first side 411 and the second side 412 is reduced. The same applies to the second side 412. As illustrated in FIG. 5C, the third side 413 is warped in a direction in which the distance DM3 between the third intermediate portion 433 and the base member 20 is larger than the distance DC1 between the first corner 421 and the base member 20 and the distance DC3 between the third corner 423 and the base member 20. In the same manner, the fourth side 414 may be warped in a direction in which the distance DM4 between the fourth intermediate portion 434 and the base member 20 is larger than the distance DC2 between the second corner 422 and the base member 20 and the distance DC4 between the fourth corner 424 and the base member 20. In other words, the second side 412 and the fourth side 414 are warped so as to project in the direction away from the base member 20. Then, in the cooling step to be performed, warpage of the third side 413 and the fourth side 414 is reduced.

In this example as well, the distance DM3 between the third intermediate portion 433 and the base member 20 is smaller than the distance DM1 between the first intermediate portion 431 and the base member 20. In the same manner, the distance between the fourth intermediate portion 434 and the base member 20 is smaller than the distance between the third intermediate portion 433 and the base member 20. However, the distances DM3 and DM1 may be the same, and the distance DM1 may be smaller than the distance DM3. The distance between the fourth intermediate portion 434 and the base member 20 is also the same as the distance between the third intermediate portion 433 and the base member 20.

Strictly speaking, the amount of warpage of the frame member 40 is expressed by a difference in height between an intermediate portion of a certain side and corners included in the corresponding side from the reference surface indicated by a chain line described above. Specifically, for example, the frame member 40 is placed on the surface place, and given points of the respective sides are measured by using a laser displacement gauge from above, so that measurement is easily achieved. Specifically, positions to be measured are indicated by points C1 to C4 at the corners, and points M1 to M4 in the intermediate portion.

In a practical use, the amount of warpage may be considered to be a difference between the distance to an intermediate portion of a certain side and a distance to corners that the corresponding side includes from the base member 20 indicated by the double chain line described above. The heights of the corners included in each of the sides may be an average value. In other words, when speaking about the first side 411 described above, the amount of warpage of the first side 411 may be expressed by DM1−(DC1+DC2)/2.

The thickness of the frame member 40 will be described. A thickness T of each frame side is an average value of the thicknesses of the two corners and the intermediate portion. The thicknesses of the respective portions correspond to a distance between the lower surface 401, which is a joint surface of the frame member 40 with respect to the base member 20, and the upper surface 402 which is a surface on the opposite side thereof. The thicknesses of the frame member 40 of this example at the corners and the intermediate portion have little difference. The amount of warpage is preferably 1/100 or more the thickness T for achieving a practical effect. The amount of warpage described above may be smaller than the thickness T of the frame member 40. A sufficient effect may be obtained even when the amount of warpage is 1/10 the thickness T or smaller. If the amount of warpage is extremely large, an adhesion failure may occur.

A practical amount of warpage is 10 to 100 µm and preferably between 20 to 80 µm. When the amount of warpage before adhesion is smaller than 20 µm, the amount of warpage of the frame member 40 of the mounting member 24 in the opposite direction after the adhesion with the base member 20 may be increased. When the amount of warpage is larger than 80 µm, the height of application of an adhesive agent 520 for joining the base member 20 and the intermediate portions of the respective sides of the frame member 40 is necessary, and adhesion failure is likely to occur. When the amount of warpage is too large, handling of the frame member 40 by means of suction becomes difficult, and hence productivity may be lowered. Furthermore, if the amount of warpage is too large, the amount of warpage on the frame member 40 of the mounting member 24 is not decreased sufficiently even after the warpage is reduced, so that the flatness is lowered.

The shape of warpage is not specifically limited. The shape of the warpage may be an arcuate shape as a whole in the direction of the length of the side, and may be formed by correction using a leveler or the like or a method of bending work. Instead of the arcuate shape, the shape of warpage may be a linear shape from the corners to the intermediate portion of the corresponding side, and bent at a center portion thereof. This shape may be formed by placing a supporting point near a center of the side and bending the side from both ends. Also, a shape swelled into a convex shape only at a center portion thereof is also applicable and this shape may be formed by pushing a portion near the center of the side upward while holding portions near both ends of the side downward.

Subsequently, a method of manufacturing the electronic component by using the mounting member 24 described above will be described with reference to FIGS. 7A to 7D.

Figure 7A:
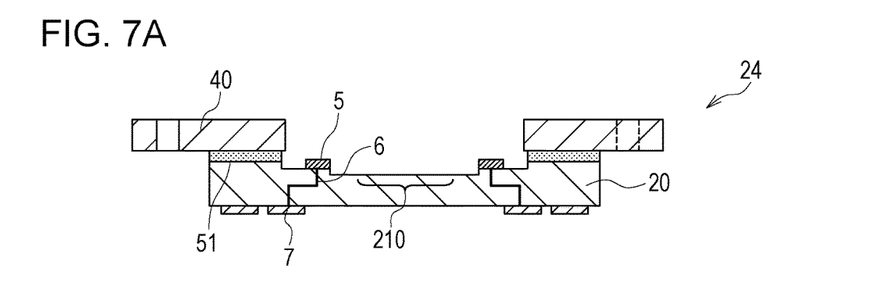
FIGS. 7A to 7D are schematic drawings of an example of a method of manufacturing an electronic component.

As illustrated in FIG. 7A, the mounting member 124 manufactured according to the manufacturing method described above is prepared. Therefore, the mounting member 24 in which the frame member 40 has a high flatness is prepared.

Figure 7B:
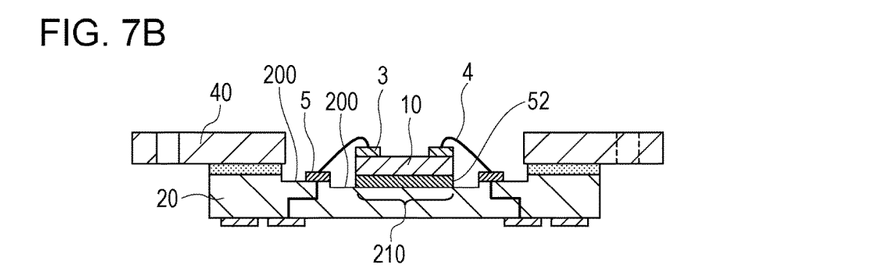

FIG. 7B illustrates a step of fixing the electronic device 10 on the base member 20 of the mounting member 24. The electronic device 10 is preferable in the case of optical devices such as an imaging device or a display device. It is because the optical devices as described above are influenced by the flatness of the electronic component. The electronic device 10 includes an electrode 3. The adhesive agent 520 such as die bond paste is applied to at least one of the arrangement region 210 of the base member 20 and a back surface of the electronic device 10 and both are adhered to each other, so that the electronic device 10 is fixed to the base member 20 via a joint member 52 formed by curing the adhesive agent 520. After the fixation, the electrode 3 on the electronic device 10 and the internal terminals 5 are connected by a connected conductor 4 such as a metal wire.

Figure 7C:
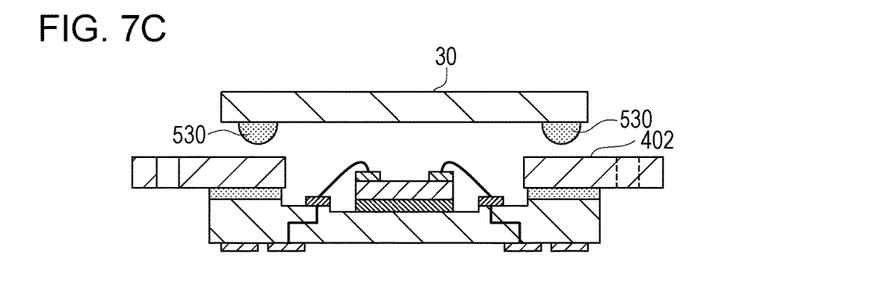
Figure 7D:
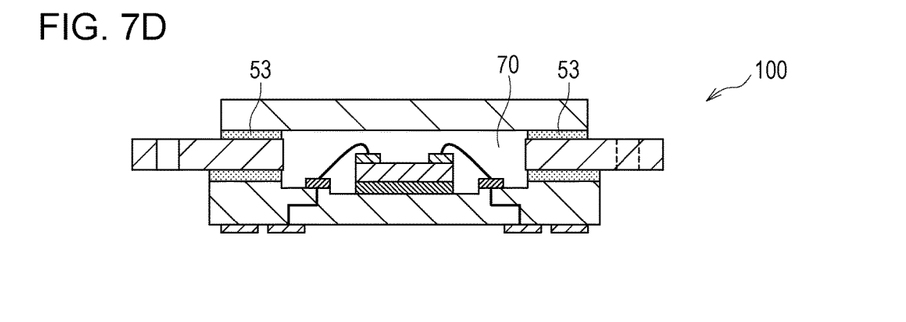

FIG. 7C illustrates a step of placing the lid member 30 on the frame member 40. A photocrosslinkable adhesive agent 530 is applied to at least one of the lid member 30 and the frame member 40. In FIG. 7C, the photocrosslinkable adhesive agent 530 is applied to the lid member 30. However, the adhesive agent 530 may be applied to the frame member 40. The adhesive agent 530 may be a thermosetting adhesive agent. The lid member 30 is a plate member formed of glass or crystal. After the adhesive agent 530 has been applied, the lid member 30 is placed on the frame member 40 as illustrated in FIG. 7D. The adhesive agent 530 is filled between an entire outer peripheral portion of the lid member 30 and the upper surface 402 of the frame member 40.

FIG. 7D is a step of adhering the lid member 30 to the frame member 40. By irradiating the adhesive agent 530 with light such as UV light via the lid member 30, the adhesive agent 530 is cured photocrosslinkably and an joint member 53 is formed, whereby adhesion is completed. As described above, since the mounting member 24 has a high flatness, the frame member 40 and the lid member 30 may be preferably adhered. The color of the photocrosslinkable adhesive agent 530 and the joint member 53 is transparent with respect to visible light and/or invisible light, specifically to UV light in the case of the photocrosslinkable resin. The adhesive agent 530 and the joint member 53 may include inorganic or organic filler to an adequate amount. Including the filler contributes to an improvement of moisture resistance.

Although a coefficient of elasticity of the joint member 53 after the adhesive agent 530 has been cured is not specifically limited, relatively soft resins (resin having low coefficients of elasticity) having coefficients of elasticity, for example, in a range from 1 MPa to 100 GPa inclusive are preferable.

Example 1

Twenty each of mounting members A to G were manufactured by using the ceramic base member 20 and the metallic frame member 40 by using the manufacturing method described with reference to FIGS. 3A to 3E. Twenty each of mounting members H to I for comparison were manufactured as well.

First of all, an SUS 430 (18 chrome stainless) having a thermal expansion coefficient of 10.3 ppm/K (=$10^{-6}$/°C.) was used as the frame member 40, and the frame member 40 having a quadrilateral illustrated in FIGS. 1A and 1B was manufactured by punching with a metallic die. The thickness of the frame member 40 was 0.8 mm, an outer diameter in an X-direction was 42.0 mm (including widths of the expanded portions 404 provided on the left and right, each being 4.5 mm), and a size of an opening was 27.4 mm. The outer diameter of the frame member 40 in a Y-direction was 27.4 mm, and the size of the opening was 22.6 mm. Subsequently, in order to make the frame member 40 flat once, the frame member 40 was passed through a pressing step.

Subsequently, twenty each of the frame members A to I having different standards of the amount of warpage were manufacture as the frame members 40. The amounts of warpage of the respective frame members 40 are shown in Table 1. The frame members 40 were manufactured by preparing a press jig configured to allow an adjustment in height on the basis of a pin method is possible, and being subjected to deformation work in the pressing step so as to have a predetermined amount of warpage. By the fine adjustment of the pin height, it was finally confirmed that the respective standards were achieved with an accuracy on the order of several micrometers as expected. The frame members A to G were frame members warped so as to project toward the upper surface 402 to which the lid member 30 is to be adhered. Then, the frame member H having a flat shape was manufactured, and the frame member I warped toward the lower surface 401 to which the base member 20 was to be adhered was manufactured for the comparison. The amounts of warpage of the respective sides of the respective frame members are as shown in Table 1. Numerical values of the amount of warpage attached with "−" in Table 1 indicate that warpage had a projection toward the base member 20, and numerical values having no "−" attached thereto and not being zero indicate that the warpage had a projection in the direction away from the base member 20. The values of the respective amounts of warpage were those obtained by averaging twenty each of measured values and indicated in every 5 µm. For example, a value of 20 µm indicate that the average value fell in a range from 17.5 µm to 22.5 µm inclusive.

Rectangular depressed base members 20 obtained by laminating three layers of alumina ceramic having a thermal expansion coefficient of 7.1 ppm/K were prepared. The base member 20 had a thickness of 1.4 mm as a total thickness of the three layers, a thickness from the lower level portion 200 to the back surface 206 was 0.8 mm, a thickness of 0.38 mm from the lower level portion 200 to the middle level portion 202, and a thickness of 0.22 mm from the middle level portion 202 to the upper level portion 204. An outer diameter of the base member 20 in the X direction was 32.0 mm, and the outer diameter in the Y-direction was 26.4 mm.

The thermosetting adhesive agent 510 used here was an epoxy-based adhesive agent. By applying a temperature of 150° C. as a temperature required for curing, the thermosetting adhesive agent was cured to join the base member 20 and the frame member 40, so that the mounting member 24 was obtained. The mounting members A to I as the mounting member 24 correspond to the frame members A to I having common alphabets. For example, the mounting member A is a mounting member manufactured by using the frame member A.

Following evaluation was performed on the mounting members A to I obtained as described above. The result of evaluation is also shown in Table 1.

First of all, the flatness error of the upper surfaces 402 of the frame members 40 of the obtained mounting members A to I were measured by the laser displacement gauge. The flatness errors are indicated by distances between two planes in the case where all the points at the measurement points were located between the two planes parallel to each other. The points of measurement were the corners C1 to C4 and the intermediate portions M1 to M4 illustrated in FIG. 2. Since the flatness error is obtained at the heights at eight points in this manner, a calculating method is different from the method of calculating the amount of warpage defined by three points on the respective sides. In Table 1, numerical values of the flatness error attached with "−" in Table 1 indicate that the first side and the second side, which were long sides, were warped so as to project toward the base member 20, and the numerical values attached with "+" indicate that the first side and the second side, which were long sides, were warped in the direction away from the base member 20. The mounting members I having a long side warped so as to project toward the lower surface 401 before adhesion was warped so as to project toward the lower surface 401 after adhesion, and the amount of warpage was increased. The mounting members F and H, which had flat long sides before adhesion were warped so as to project toward the lower surface 401 after adhesion. In contrast, the mounting members C and D having long sides which were warped so as to project relatively significantly toward the upper surface 402 before adhesion were warped so as to project toward the upper surface 402 after adhesion as well. However, the amount of warpage was decreased in comparison with that before adhesion. Also, the mounting member A having a long side warped so as to project by a relatively small extent toward the upper surface 402 before adhesion was warped so as to project toward the lower surface 401 after adhesion, and the amount of warpage was increased in comparison with that before adhesion. The mounting members B, E, and G having long sides warped so as to project toward the upper surface 402 by an amount less than that of the mounting members C and D, and more than that of the mounting member A before adhesion were warped so as to project toward the upper surface 402 after adhesion, and the amount of warpage was decreased in comparison with that before adhesion. As regards the short sides, those warped so as to project toward the lower surface 401 before adhesion and those warped so as to project toward the upper surface 402 were warped so as to project toward the lower surface 401 after adhesion. When the base member 20 of each of the mounting members A to I was observed from the back surface 206, it was found that the base member 20 was warped in the longitudinal direction along the first side and the second side so as to project toward the back surface 206. While the mounting members H and I had the flatness error on the order of 70 to 80 µm, the mounting members A to G had values of 50 µm or smaller. Therefore, by using the frame member 40 warped so as to project in the direction away from the base member 20, the flatness error smaller than 70 µm, which was the flatness error of the mounting member H, was obtained, and hence the fact that the flatness was improved was confirmed.

Whether or not the frame member 40 and the base member 20 were reliably adhered was measured by an ultrasonic flaw detection scanner for each of the manufactured mounting members A to I. Consequently, it was found that only two of the twenty mounting members D in which the frame member D was used had an adhesion failure portion. The frame member D had a large amount of warpage, which was as large as 100 µm, and it was apparent that adhesion property varies with such a large amount of warpage. In terms of stable manufacture of an electronic component 100, it is desirable to minimize the variation in adhesion property and hence the amount of warpage of the frame member 40 as much as 80 µm before adhesion is desirable.

In addition, when observing the mounting members E and F, the flatness error was 50 µm or smaller in the case where only two opposed sides project upward, and hence it was found that the advantages are obtained even in the case where only the opposed two sides project upward.

When the mounting members E, F, and G are compared, it was found that the flatness error is reduced and a higher effect on the flatness error was obtained when the amount of warpage on the long side is larger than the amount of warpage on the short side.

TABLE 1

| Standard | Amount of Warpage of Frame Member (μm) | | | | Mounting Member | | Sealing Property of Thermosetting Adhesive Agent |
|---|---|---|---|---|---|---|---|
| | first side | second side | third side | fourth side | standard | flatness error (average value) | |
| Frame member A | 20 | 20 | 20 | 20 | Mounting Member A | −30 μm | 20/20 |
| Frame member B | 50 | 50 | 50 | 50 | Mounting Member B | −20 μm | 20/20 |
| Frame member C | 80 | 80 | 80 | 80 | Mounting Member C | +30 μm | 20/20 |
| Frame member D | 100 | 100 | 100 | 100 | Mounting Member D | +40 μm | 18/20 |
| Frame member E | 50 | 50 | 0 | 0 | Mounting Member E | −25 μm | 20/20 |
| Frame member F | 0 | 0 | 50 | 50 | Mounting Member F | −35 μm | 20/20 |
| Frame member G | 50 | 50 | 25 | 25 | Mounting Member G | −15 μm | 20/20 |
| Frame member H | 0 | 0 | 0 | 0 | Mounting Member H | −70 μm | 20/20 |
| Frame member I | −20 | −20 | −20 | −20 | Mounting Member I | −80 μm | 20/20 |

*In the table, numerators indicate the number of accepted electronic components

Example 2

Subsequently, electronic components A to I were manufactured as the electronic component 100 by the manufacturing method descried with reference to FIGS. 7A to 7D by using the mounting members A to I manufactured in the process described above. The electronic components A to I correspond to the mounting members A to I having common alphabets. For example, the electronic component A is an electronic component manufactured by using the mounting member A.

As the electronic device 10, a so-called CMOS image sensor having an APS-C size, which is 24 mm×18 mm in planar dimensions was prepared. The electronic device 10 was fixed to the arrangement region 210 of the base member 20 by using the joint member 52 obtained by solidifying a black die bonding adhesive agent. Subsequently, the electrode 3 and the internal terminals 5 provided in the electronic device 10 were electrically connected by the connected conductor 4 formed of a gold wire by using a wire bonding apparatus.

Subsequently, an alpha ray resistant glass plate having a thickness of 0.5 mm was prepared as the lid member 30. A dimension in the X direction of the lid member 30 was 31.8 mm, and a dimension in the Y-direction was 26.3 mm, so as to have the substantially same outer diameter as that of the base member 20. An UV-cured resin as photocrosslinkable adhesive agent 530 is applied to one of the surfaces of the lid member 30 with a dispenser into a frame shape, and the lid member 30 is placed on the frame member 40 with the surface on which the adhesive agent 530 is applied faced toward the frame member 40. At this time, spherical-shaped particles having a diameter of 30 μm were mixed to the adhesive agent 530 as a spacer, so that the thickness of the adhesive agent 530 was approximately 30 μm. Then, the electronic device 10 was irradiated with UV light via the lid member 30 to achieve photocrosslinking processing.

The electronic components A to I were manufactured in this manner.

TABLE 2

| | Process Fluidity | Sealing Property of Photocrosslinkable Adhesive Agent |
|---|---|---|
| Electronic Component A | 20/20 | 20/20 |
| Electronic Component B | 20/20 | 20/20 |
| Electronic Component C | 20/20 | 20/20 |
| Electronic Component D | 20/20 | 20/20 |
| Electronic Component E | 20/20 | 20/20 |
| Electronic Component F | 20/20 | 20/20 |
| Electronic Component G | 20/20 | 20/20 |
| Electronic Component H | 17/20 | 15/20 |
| Electronic Component I | 16/20 | 13/20 |

*In the table, numerators indicate the number of accepted electronic components

Evaluation on process fluidity and sealing property of the photocrosslinkable adhesive agent 530 was performed on the electronic components A to I. The process fluidity was evaluated by inspecting the number of occurrence of the products which flows in the steps illustrated in FIGS. 7A to 7D illustrated in the embodiment and subjected to a handling error such as a suction error caused by the flatness error. The sealing property of the photocrosslinkable adhesive agent 530 was visually evaluated by inspecting whether the entire periphery of the glass was sealed by the joint member 53.

Table 2 shows the result of the evaluation described above, and the number of accepted electronic components out of the twenty electronic components is shown. All of the electronic components A to G were accepted in terms of the process fluidity and the sealing property of the photocrosslinkable adhesive agent 530. It is considered that since the flatness of the surfaces of the frame members in the mounting members A to G was desirable, no suction error occurred, and the hermetical sealing was achieved with the stable photocrosslinkable adhesive agent 530.

In contrast, it is considered that the flatness errors of the upper surfaces of the frame members of the mounting members H and I were as large as 70 to 80 μm due to the insufficient flatness, and hence the suction error occurred and the sealing property to be achieved by the photocrosslinkable adhesive agent 530 was not sufficient.

According to the embodiments described above, mounting members having a frame member with high flatness are provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-039447, filed in Feb. 28, 2013, which is hereby incorporated by reference herein in its entirety.

What is claimed is:

1. A method of manufacturing a mounting member including a base member having an arrangement region for an electronic device, and a frame member having an opening corresponding to the arrangement region and adhered to a periphery of the arrangement region of the base member, comprising:
   placing a base member and a frame member having a thermal expansion coefficient different from a thermal expansion coefficient of the base member in a state in which the base member is stacked with the frame member and a thermosetting adhesive agent is interposed between the base member and the frame member;
   adhering the base member and the frame member by heating the base member, the frame member, and the adhesive agent from the state to a temperature equal to or higher than a curing temperature of the adhesive agent; and
   cooling the base member and the frame member from the curing temperature, wherein the frame member has a quadrilateral shape including:
   a first side including a first corner, a second corner and a first intermediate portion between the first corner and the second corner,
   a second side including a third corner, a fourth corner, and a second intermediate portion between the third corner and the fourth corner,
   a third side including the first corner, the third corner, and a third intermediate portion between the first corner and the third corner, and
   a fourth side including the second corner, the fourth corner, and a fourth intermediate portion between the second corner and the fourth corner, and
   in the state, the first side is warped so that a distance between the first intermediate portion and the base member is larger than a distance between the first corner and the base member and a distance between the second corner and the base member, and
   in the state, the second side is warped so that a distance between the second intermediate portion and the base member is larger than a distance between the third corner and the base member and a distance between the fourth corner and the base member, and
   in the cooling, a deformation in which warpage of the first side is reduced occurs in the first side, and a deformation in which the warpage of the second side is reduced occurs in the second side.

2. The method of manufacturing a mounting member according to claim 1, wherein the thermal expansion coefficient of the frame member is higher than the thermal expansion coefficient of the base member.

3. The method of manufacturing a mounting member according to claim 1, wherein in the state, the distance between the first intermediate portion and the base member and a distance between the second intermediate portion and the substrate are larger than a distance between the third intermediate portion and the base member and a distance between the fourth intermediate portion and the base member.

4. The method of manufacturing a mounting member according to claim 1, wherein in the state, the third side is warped so that the distance between the third intermediate portion and the base member is larger than the distance between the first corner and the base member and the distance between the third corner and the base member, and the fourth side is warped so that the distance between the fourth intermediate portion and the base member is larger than a distance between the second corner and the base member and a distance between the fourth corner and the base member, and
   in the cooling, a deformation in which warpage of the third side is reduced occurs in the third side, and a deformation in which the warpage of the fourth side is reduced occurs in the fourth side.

5. The method of manufacturing a mounting member according to claim 1, wherein in the state, a difference between the distance between the first intermediate portion and the base member and the distance between the first corner and the base member, and a difference between the distance between the first intermediate portion and the base member and the distance between the second corner and the base member is smaller than a thickness of the first intermediate portion.

6. The method of manufacturing a mounting member according to claim 1, wherein in the state, the difference between the distance between the first intermediate portion and the base member and the distance between the first corner and the base member, and the difference between the distance between the first intermediate portion and the base member and the distance between the second corner and the base member is between 1/100 and 1/10 inclusive of the thickness of the first intermediate portion.

7. The method of manufacturing a mounting member according to claim 1, wherein in the cooling, the frame member is warped in a direction opposite to the warpage of the frame member in the state.

8. The method of manufacturing a mounting member according to claim 1, wherein the frame member is formed of a metal, and the base member is formed of a ceramic.

9. A method of manufacturing an electronic component comprising:
   preparing a mounting member formed by using a method of manufacturing a mounting member according to claim 1;
   fixing an electronic device to the base member; and
   adhering a lid member facing the electronic device to the frame member.

10. The method of manufacturing an electronic component according to claim 9, wherein the lid member is adhered to the frame member by using a photocrosslinkable adhesive agent.

11. The method of manufacturing an electronic component according to claim 9, wherein the electronic device is an imaging device.

12. The method of manufacturing an electronic component according to claim 9, wherein the electronic device is fixed to the base member by an adhesive agent interposed between the electronic device and the base member.

13. The method of manufacturing an electronic component according to claim 9, further comprising connecting an electrode of the electronic device and a terminal of the mounting member by a metal wire.

14. The method of manufacturing a mounting member according to claim 1, wherein the frame member includes an expanded portion which is provided with a through hole, and in the adhering the base member and the frame member, the through hole does not overlap the base member.

\* \* \* \* \*